United States Patent
Chan et al.

(10) Patent No.: US 8,325,543 B2
(45) Date of Patent: Dec. 4, 2012

(54) GLOBAL BIT SELECT CIRCUIT INTERFACE WITH FALSE WRITE THROUGH BLOCKING

(75) Inventors: Yuen Hung Chan, Poughkeepsie, NY (US); Antonia R. Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 12/713,636

(22) Filed: Feb. 26, 2010

(65) Prior Publication Data
US 2011/0211400 A1     Sep. 1, 2011

(51) Int. Cl.
*G11C 19/08* (2006.01)
(52) U.S. Cl. .................................... 365/190
(58) Field of Classification Search ............ 365/190
See application file for complete search history.

(56) References Cited

U.S. PATENT DOCUMENTS

| | | |
|---|---|---|
| 5,630,091 A | 5/1997 | Lin et al. |
| 5,729,501 A | 3/1998 | Phillips et al. |
| 5,806,084 A | 9/1998 | Lin et al. |
| 6,002,633 A | 12/1999 | Oppold et al. |
| 6,047,359 A | 4/2000 | Fouts |
| 6,058,065 A | 5/2000 | Lattimore et al. |
| 6,091,629 A * | 7/2000 | Osada et al. .............. 365/156 |
| 6,529,519 B1 | 3/2003 | Steiner et al. |
| 6,633,501 B2 | 10/2003 | Wedel |
| 6,657,886 B1 | 12/2003 | Adams et al. |
| 6,876,595 B2 | 4/2005 | Bhavnagarwala et al. |
| 7,065,613 B1 | 6/2006 | Flake et al. |
| 7,102,946 B2 | 9/2006 | Pelella |
| 7,113,433 B2 * | 9/2006 | Chan et al. .............. 365/190 |
| 7,170,774 B2 | 1/2007 | Chan et al. |
| 7,272,030 B2 | 9/2007 | Chan et al. |
| 7,293,209 B2 | 11/2007 | Chan et al. |
| 7,305,602 B2 | 12/2007 | Chan et al. |

(Continued)

FOREIGN PATENT DOCUMENTS
WO     2008150927 A2     12/2008

OTHER PUBLICATIONS

A. R. Pelella et al.; "A 8Kb Domino Read SRAM with Hit Logic and Parity Checker;" ESSCIRC, Grenoble, France 2005; pp. 359-362.

*Primary Examiner* — Hoai V Ho
*Assistant Examiner* — Min Huang
(74) *Attorney, Agent, or Firm* — Cantor Colburn LLP; William A. Kinnaman, Jr.

(57) ABSTRACT

A global to local bit line interface circuit for domino SRAM devices includes a pair of complementary global write bit lines in selective communication with an array of SRAM cells through corresponding local write bit lines, the complementary global write bit lines configured to write a selected SRAM cell with data presented on a pair of complementary write data input lines; a pair of complementary global read bit lines in selective communication with the array of SRAM cells through corresponding local read bit lines, the complementary global read bit lines configured to read data stored in a selected SRAM cell and present the read data on a pair of complementary read data output lines; and blocking logic configured to prevent, during a write operation, propagation of stored data from the SRAM cells out on the complementary read data output lines prior to completion of the write operation.

20 Claims, 5 Drawing Sheets

U.S. PATENT DOCUMENTS

| | | |
|---|---|---|
| 7,336,546 B2 | 2/2008 | Chan et al. |
| 7,356,656 B1 | 4/2008 | Chang |
| 7,420,858 B2 | 9/2008 | Joshi |
| 7,463,537 B2 * | 12/2008 | Chan et al. .................... 365/190 |
| 7,478,297 B2 | 1/2009 | Chan et al. |
| 7,535,776 B1 | 5/2009 | Behrends et al. |
| 7,596,050 B2 | 9/2009 | Scheuerlein et al. |
| 7,975,109 B2 | 7/2011 | McWilliams et al. |
| 2004/0083329 A1 * | 4/2004 | Osada et al. ...................... 711/1 |
| 2006/0268656 A1 | 11/2006 | Yokoyama |
| 2007/0127305 A1 | 6/2007 | Imai et al. |
| 2008/0056052 A1 | 3/2008 | Chan et al. |
| 2008/0247246 A1 * | 10/2008 | Joshi ............................ 365/195 |
| 2008/0298137 A1 | 12/2008 | Chan et al. |
| 2008/0301256 A1 | 12/2008 | McWilliams et al. |
| 2008/0310246 A1 | 12/2008 | Joshi et al. |
| 2009/0154213 A1 | 6/2009 | Kim et al. |
| 2009/0285009 A1 | 11/2009 | Kim et al. |
| 2010/0214857 A1 | 8/2010 | Hsu et al. |
| 2010/0220531 A1 * | 9/2010 | Shinagawa et al. ...... 365/185.24 |
| 2011/0211401 A1 | 9/2011 | Chan et al. |

* cited by examiner

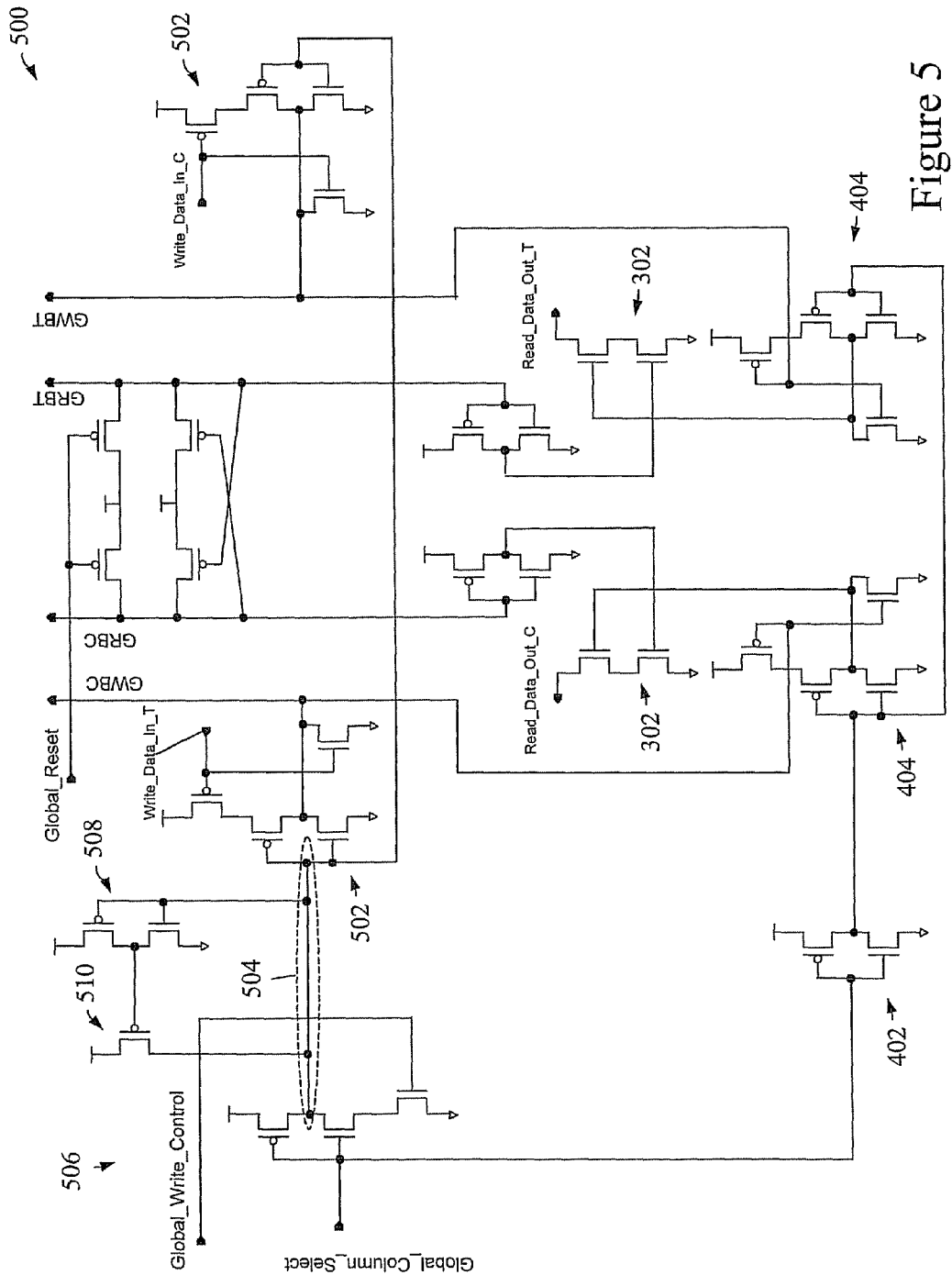

GLOBAL BIT SELECT CIRCUIT INTERFACE WITH FALSE WRITE THROUGH BLOCKING

BACKGROUND

The present invention relates generally to integrated circuit memory devices and, more particularly, to a high performance, domino Static Random Access Memory (SRAM) in which the core cells of the memory are segmented into subarrays accessed by local bit lines connected to global bit lines, with an interface between dual read and write global bit line pairs and local bit line pairs.

As will be appreciated by those skilled in the art, in a domino SRAM, the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM. More detailed information regarding the construction and operation of domino SRAMs may be found in U.S. Pat. Nos. 5,729,501 and 6,657,886, both assigned to the assignee of this application, and incorporated herein by reference.

In addition, U.S. Pat. No. 6,058,065, also assigned to the assignee of this application and incorporated herein by reference, discloses a memory array in which the core cells are organized in subarrays accessed by local bit lines connected to global bit lines. U.S. Pat. No. 7,113,433, also assigned to the assignee of this application and incorporated herein by reference, discloses a domino SRAM with one pair of global bit lines for a read operation and another pair of global bit lines for a write operation. An advantage of having two global bit line pairs is better overall performance in terms of faster reading from and writing to the memory cells. However, it is important that the interface from the global bit lines to the local bit line pairs does not detract from these performance gains.

SUMMARY

In an exemplary embodiment, a global to local bit line interface circuit for domino static random access memory (SRAM) devices includes a pair of complementary global write bit lines in selective communication with an array of SRAM cells through corresponding local write bit lines, the complementary global write bit lines configured to write a selected SRAM cell with data presented on a pair of complementary write data input lines; a pair of complementary global read bit lines in selective communication with the array of SRAM cells through corresponding local read bit lines, the complementary global read bit lines configured to read data stored in a selected SRAM cell and present the read data on a pair of complementary read data output lines; and blocking logic configured to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

In another embodiment, a method of implementing reading and writing data in domino static random access memory (SRAM) devices includes selectively coupling a pair of complementary global write bit lines in with an array of SRAM cells through corresponding local write bit lines, the complementary global write bit lines configured to write a selected SRAM cell with data presented on a pair of complementary write data input lines; selectively coupling a pair of complementary global read bit lines with the array of SRAM cells through corresponding local read bit lines, the complementary global read bit lines configured to read data stored in a selected SRAM cell and present the read data on a pair of complementary read data output lines; and configuring blocking logic to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

BRIEF DESCRIPTION OF THE SEVERAL VIEWS OF THE DRAWINGS

Referring to the exemplary drawings wherein like elements are numbered alike in the several Figures:

FIG. 5 is a schematic diagram of a domino SRAM global to local bit select circuit configured for false write-through data blocking, in accordance with another embodiment of the invention.

DETAILED DESCRIPTION

Disclosed herein is a global bit select circuit for domino read SRAM devices that interfaces with a local bit select circuit (or group of local bit select circuits), and that uses a dual bit line approach. That is, one bit line pair is used for read operations and another bit line pair is used for write operations. More specifically, the global bit select circuit embodiments presented herein prevent false write-through data from propagating past the global bit select circuit during a write operation.

Figure 1:
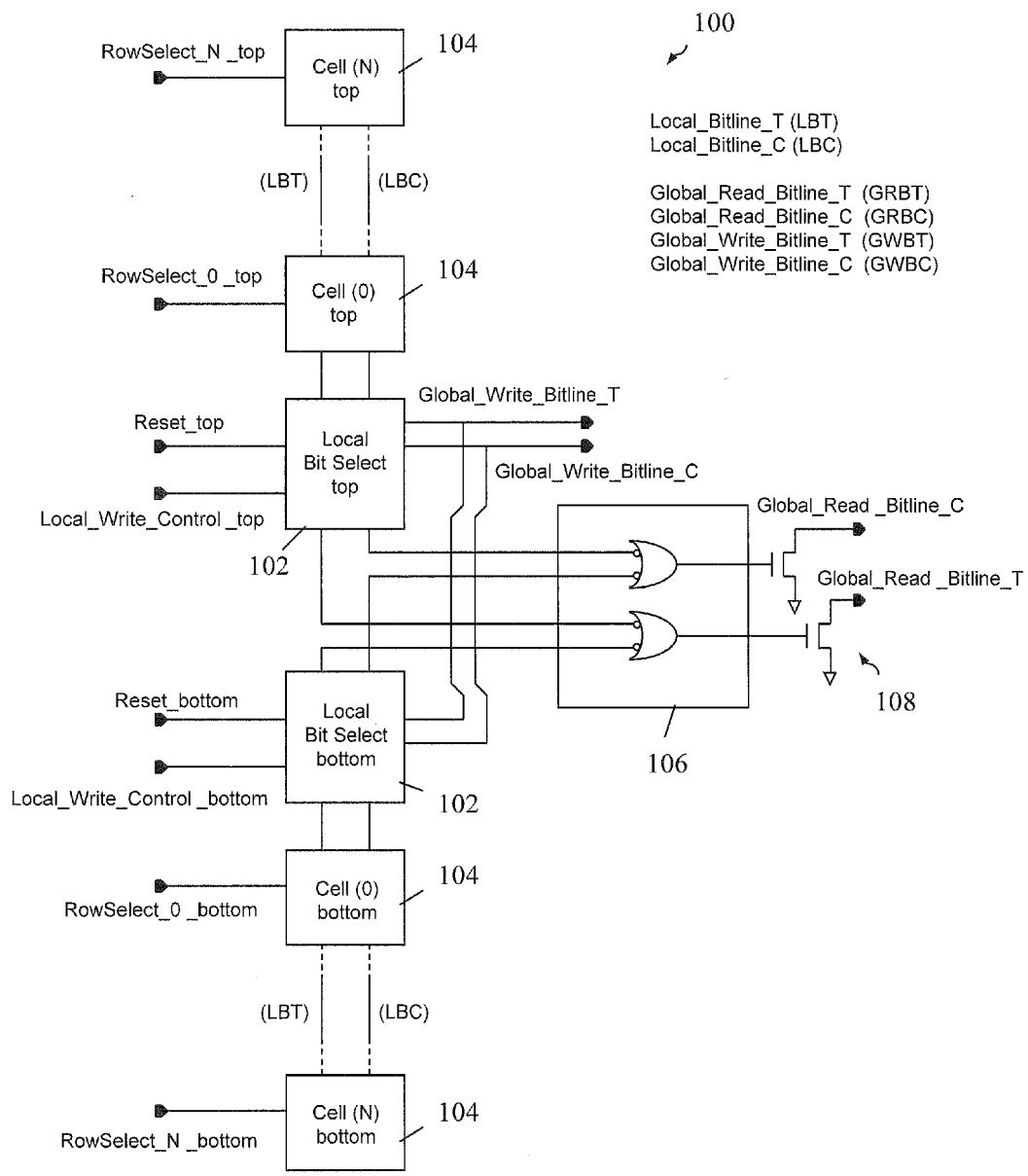
FIG. 1 is a schematic block diagram of an N-cell subarray of a domino SRAM suitable for use in accordance with an embodiment of the invention.

Referring initially to FIG. 1, there is shown a schematic block diagram of an N-cell subarray 100 of a domino SRAM suitable for use in accordance with an embodiment of the invention. The domino SRAM subarray 100 is accessed by local bit select logic 102 (top and bottom), and has 0 through N cells 102 labeled "top," as well as 0 through N cells labeled "bottom." The top and bottom cells 104 are mirrored around an active low input OR logic block 106, with half the cells on one side and half on the other. The local bit lines (labeled LBT and LBC in FIG. 1) are ORed together (i.e., the top local bit line complement (LBC) is ORed with the bottom LBC, and the top local bit line true (LBT) is ORed with the bottom LBT) to drive the wired OR NFETs (generally indicated at 108), the outputs of which are respectively connected to the complement and true global read bit lines GRBC, GRBT. In the preceding sentence and elsewhere herein, "NFET" signifies an n-channel field effect transistor (FET), while "PFET" signifies a p-channel FET.

In a standby state, the local bit lines are precharged to a logic high level. Then, for a read mode, the active memory cell (from either the top or bottom sub array) pulls down on one of the local bit lines, depending on the value of the data stored on the cell. The active low bit line, through the corresponding OR gate of block 106, turns on one of the wired OR NFETs 108 to pull down the corresponding global read bit line (GRBC or GRBT). By arranging the cells around a central point of the OR logic 106, the RC delay on the local bit lines is reduced since the distance to the furthest cell has been reduced by half. This improves the write performance as well as the read access time of the subarray.

The local bit select circuits 102, in addition to providing the read signal transfer, also provide the write control function. As further shown in FIG. 1, the top and bottom local bit select circuits 102 each have a pair of global write bit lines (GWBT and GWBC) as inputs thereto. The write operation is controlled by the local write control line (top/bottom). Further, each local bit select circuit 102 also performs, through the reset (top/bottom) signal, the bit line precharge function (also known as a bit line restore) at the end of an active read or write cycle.

Figure 2:
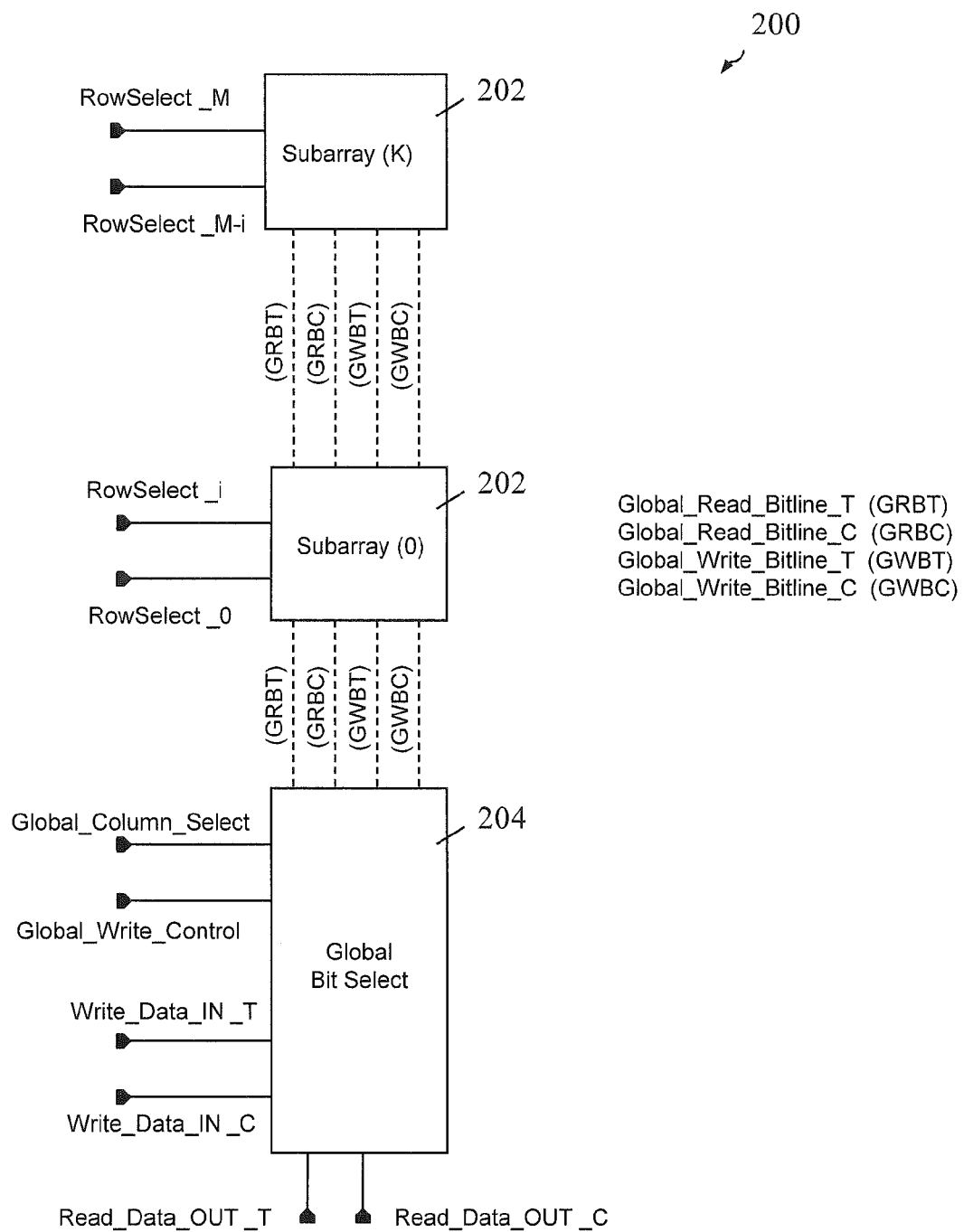
FIG. 2 is a schematic block diagram of a one-bit by M bit array of a domino SRAM where K subarrays (each containing i cells along the local bit lines) are connected to one global bit select circuit.

FIG. 2 is a schematic block diagram of a one-bit by M bit array 200 of a domino SRAM where K subarrays 202 (each containing i cells along the local bit lines) are connected to one global bit select circuit 204.

Figure 3:
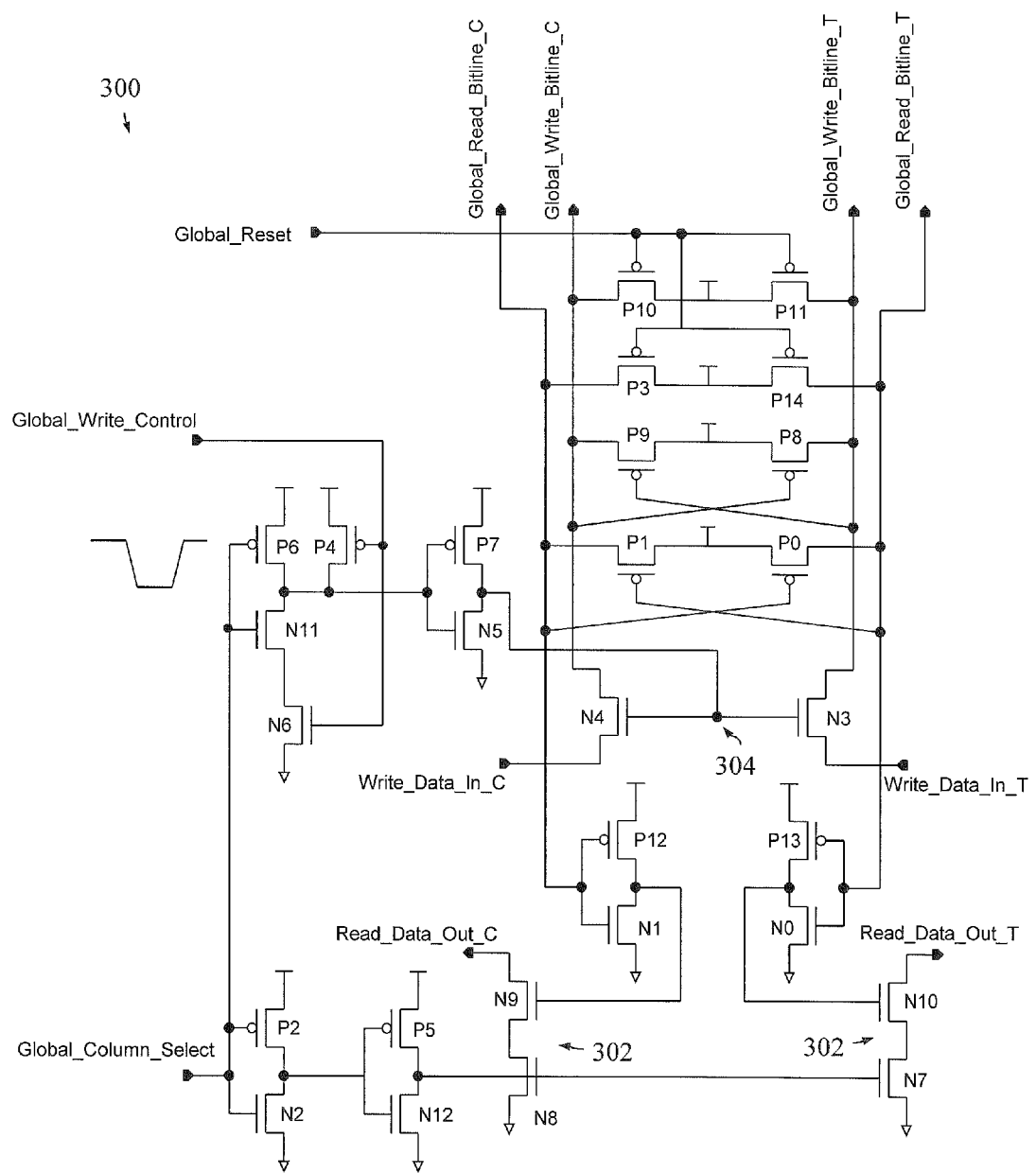
FIG. 3 is a schematic diagram of a domino SRAM global to local bit select circuit.

Referring now to FIG. 3, there is shown a schematic diagram of one implementation of a domino SRAM global to local bit select circuit 300, such as that described in the aforementioned U.S. Pat. No. 7,113,433. As is shown, the circuit 300 includes a global read bit line pair (Global_Read_Bitline_C/Global_Read_Bitline_T) as inputs thereto, and a global write bit line pair (Global_Write_Bitline_C/Global_Write_Bitline_T) as outputs therefrom. Both of the two global bit line pairs are connected to the local bit select circuits (not shown in FIG. 3) along the bit column. In addition, the circuit 300 also has a data bus, including a pair of write data inputs (Write_Data_In_C/Write_Data_In_T) and a pair of read data outputs (Read_Data_Out_C/Read_Data_Out_T). Column select signals for the circuit 300 include a Global_Column_Select signal and a Global_Write_Control signal. The Global_Column_Select signal, as the name suggests, selects the bit column for a read or a write operation. The Global_Write_Control enables the column for a write operation. Restore (precharge) of both the global read and write bit line pairs is provided by the Global_Reset signal, which is an active low signal.

In operation, when the Global_Reset signal is active low (as opposed to high during standby and read/write operations), PFET transistors P10/P11 restore the global write bit lines, while PFET transistors P3/P14 restore the global read bit lines. In addition, two pairs of cross-coupled "keep-quiet" PFET transistors (P0/P1 and P8/P9) are connected to the global read and write bit lines, respectively. When one side of the bit lines is pulled low during a read or a write operation, the corresponding PFET is turned on so to hold the opposite side of the bit line high (that is, keeping it in a quiet up level). In so doing, these cross-coupled "keep-quiet" PFETs maintain glitch-free (noise-free) read and write operations.

The Global_Column_Select input (coming from the bit decode circuitry, not shown in FIG. 3) selects the bit column for both the read and write operation, and is an active high signal. The Global_Write_Control input (also an active high signal) controls the write data bus during a write operation. In a standby mode, both the Global_Column_Select and the Global_Write_Control signals are off, while the Global_Reset signal is on (low active) to precharge both the global read and write bit lines high. Also, in the standby mode, the cross-coupled "keep-quiet" PFETs are off. The read data output bus (Read_Data_Out_C/Read_Data_Out_T) is also precharged high by data output reset circuitry (not shown in FIG. 3).

In a read mode of operation, the Global_Reset signal is first switched high, turning off the pre-charge PFETs. The Global_Column_Select input is then activated while the Global_Write_Control input is kept low (low for reading and high for writing). In so doing, the bottom NFETs (N8, N7) of the NFET stacks 302 coupled to the true and complement read data output bus become activated via the inverter pair P2/N2 and P5/N12, and will allow discharge of either Read_Data_Out_C or Read_Data_Out_T, depending on the state of the cell data. Concurrently, the common gate node 304 coupled to N3 and N4 of the circuit is kept low by the inactive Global_Write_Control signal to disable write NFETs N3/N4.

Thus, for the specific case where a "1" is read from the memory cell, Global_Read_Bitline_T will remain high, whereas Global_Read_Bitline_C will discharge. This in turn causes the output of inverter P12/N1 to go high and activate NFET N9, thereby discharging Read_Data_Out_C. Conversely, because Global_Read_Bitline_T remains high when reading a "1", the output of inverter P13/N0 remains low, keeping NFET N10 inactive and preventing the precharged Global_Read_Bitline_T from discharging. As a result, the correct complementary data is output from Global_Read_Bitline_T and Global_Read_Bitline_C.

In a write mode of operation, the Global_Reset signal is first deactivated by going high (as in the read mode), while the write data inputs (Write_Data_In_C/Write_Data_In_T) are presented with write data thereon. That is, one of the precharged Write_Data_In_C/Write_Data_In_T lines is pulled low while the other remains in the precharged high state. Then, both the Global_Column_Select and the Global_Write_Control inputs are both activated. Thus, in addition to driving node 304 high and activating the writing NFETs N3/N4, the bottom NFETs (N8, N7) of the NFET stacks 302 coupled to the true and complement read data output bus also become activated in the write mode.

For a specific case where a "0" is to be written to the memory cell, for example, the Write_Data_In_T signal is held low, pulling down Global_Write_Bitline_T through N3. Because Write_Data_In_C is held high, Global_Write_Bitline_C will not discharge through N4 and instead remain high. This state of the global write bit lines is passed to the local bit select circuit (not shown in FIG. 3), which in turn writes a "0" into the selected memory cell. Notably, because the output of inverter P5/N12 is also high during the write operation (due to Global_Column_Select being activated), and thus NFETs N7 and N8 are activated as mentioned above, write-through data (which is passing through from the local bit select circuit to the global read bit lines) is therefore also available on the read data output bus (Read_Data_Out_C/Read_Data_Out_T).

It is thus possible that during a write operation, if the word line rises before the global write bit line signal, the cell will begin to read by initially pulling down one of the local bit lines. Then as the write operation proceeds, the other bit line may also be pulled down (if the write operation is intended to write opposite data into the cell), leaving both Read_Data_Out_C and Read_Data_Out_T in an active, discharging state in turn resulting in a metastable "X" state at the output of the global bit select circuit. Such a condition is referred to herein as a Fast Read Before Write (FRBW).

Figure 4:
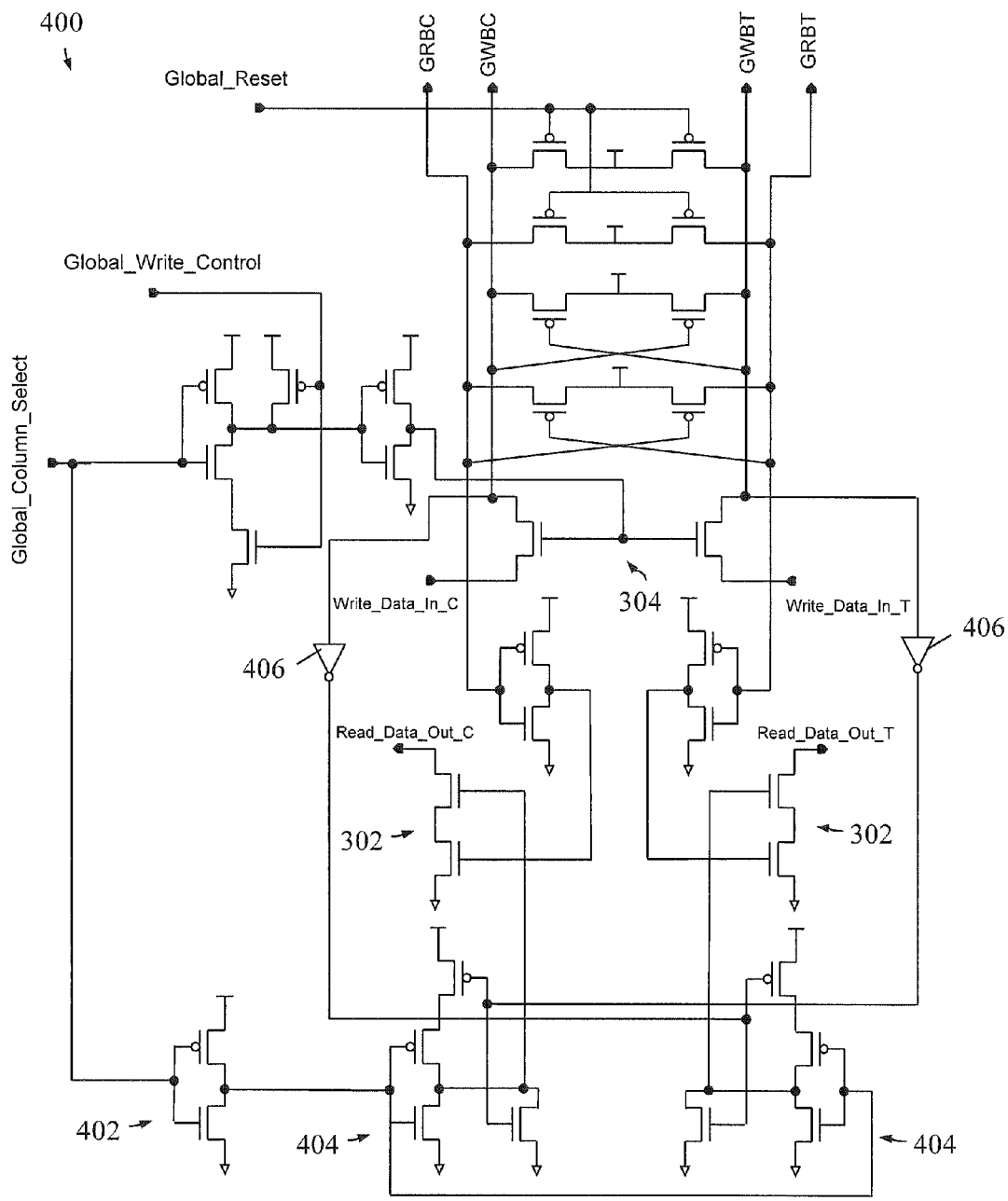
FIG. 4 is a schematic diagram of a domino SRAM global to local bit select circuit configured for false write-through data blocking, in accordance with an embodiment of the invention.

Accordingly, FIG. 4 is a schematic diagram of a domino SRAM global to local bit select circuit 400 configured for false write-through data blocking, in accordance with an embodiment of the invention. At a high level, the circuit 400 utilizes new blocking logic to prevent false FRBW data from producing an "X" state. Whereas the circuit 300 of FIG. 3 automatically enables both of the NFET stacks 302 to propagate data to the read data output bus during a write mode, the circuit 400 (during write operation) only allows either the true or the complement data from propagating out. Stated another way, during a write mode, one of the pair of the NFET stacks associated with Read_Data_Out_C and Read_Data_Out_T in the new circuit 400 is automatically disabled, depending upon the value of the write data itself, as explained in further detail below.

For purposes of clarity, similar components of the global to local bit select circuit 400 with respect to that of FIG. 3 are designated with the same reference numbers and characters in FIG. 4 where applicable. In addition, the description of similar circuit devices, such as the precharging PFETs, "keep-quiet" PFETs and global write control circuitry is also omitted. As will first be noted from FIG. 4, the circuit 400 (rather than using only the Global_Column_Select signal to control the activation of the NFET stacks) replaces the inverter pair (P2/N2 and P5/N12) of FIG. 3 with a single inverter 402 and parallel NOR gates 404 in FIG. 4. The outputs of the NOR gates 404 are in turn used to control the activation of the NFET stacks 302 associated with Read_Data_Out_C and Read_Data_Out_T. The inverted value of Global_Column_Select represents only one of the two inputs to each NOR gate 404. The second input to the NOR gates 404, as will be seen from FIG. 4, is derived from the global write data itself. More specifically, the NOR gates 404 receive as second inputs thereto signals originating from Write_Data_In_C and Write_Data_In_T, inverted by inverters 406.

In a read mode of operation, circuit 400 behaves similar to circuit 300. Because the global write bit lines remain precharged high in this mode, the output of both inverters 406 on the true and complement sides are both low. Since the inverted value of the active Global_Column_Select signal is now low, the dual inputs to the NOR gates 404 are both low. Therefore, the outputs of the NOR gates 404 (coupled to the upper NFETs in the NFET stacks 302) are high. This means that both NFET stacks 302 are enabled for either of Read_Data_Out_C or Read_Data_Out_T to be discharged once the cell data is presented on GRBC/GRBT.

However, during a write mode, because differential signal data is now presented on the global write bit line pair GWBC/GWBT, this differential signal is also fed to the NOR gates 404, which again control the activity of the NFET stacks 302. Now, because either GWBC or GWBT is discharged during a write operation, this means that the output of one of the inverters 406 will switch from low to high. In turn, that particular NOR gate 404 to which the inverter 406 is connected will have its output switch from high to low, meaning the corresponding NFET stack 302 is deactivated. Thus, regardless of the state of the "fast read" data on GRBC/GRBT, one of the Read_Data_Out_C line or the Read_Data_Out_T line is automatically kept at a precharged high level. Thereby, simultaneous discharge of Read_Data_Out_C and Read_Data_Out_T is prevented.

To use a specific example, if "1" data is to be written to a cell, then GWBT will remain precharged high and GWBC is discharged upon activation of Global_Write_Control. In this instance, the output of the left (complement) side inverter 406 switches from low to high, while the output of the right (true) side inverter remains low. Thereby, the right (true) side NFET stack 302 remains deactivated and Read_Data_Out_T remains precharged, regardless of whether or not "fast read" cell data attempts to discharge Read_Data_Out_T. Stated another way, during a write mode, only the complement side read output data is allowed to transition to a low state if the write data is "1" while the true side output data is blocked from falling. Conversely, if the write data is "0" only the true side read output data is allowed to transition to a low state while the complement side output data is blocked from falling.

In the embodiment of FIG. 4 (as is the case for FIG. 3), the global write bit lines are precharged to a logic high value. However, an alternative global to local bit select circuit with the same functionality as circuit 400 may also be configured where the write bit lines are instead precharged low. In this regard, FIG. 5 is a schematic diagram of a domino SRAM global to local bit select circuit 500 configured for false write-through data blocking, in accordance with another embodiment of the invention.

Similar to the embodiment of FIG. 4, the NFET stacks 302 associated with Read_Data_Out_C and Read_Data_Out_T are controlled by the state of the data on the global write bit line pair, GWBC and GWBT. Here, since GWBC and GWBT are precharged low, no inverters are needed for the read mode, as the discharged GWBC and GWBT lines (being inputs to NOR gates 404) will directly enable the NFET stacks 302 for a read operation.

On the other hand, due to precharging of GWBC and GWBT to a low value, the global write control circuitry is modified with respect to the FIG. 4 embodiment. In particular, the blocking logic of circuit 500 includes an additional pair of parallel NOR gates 502, the outputs of which are coupled to GWBC and GWBT. One of the inputs of the NOR gates 502 corresponds to the input write data presented on Write_Data_In_T and Write_Data_In_C. (It will be noted that the true input write data is coupled to the NOR gate associated with the complementary global bit line, and vice versa) The other input to each NOR gate 502 is an output node 504 of a dynamic NAND gate 506, the inputs of which are the Global_Write_Control signal and the Global_Column_Select signal.

In a standby state, the Global_Column_Select signal is deactivated, which initially charges node 504 high. In order to maintain stability of the node 504, the dynamic NAND gate 506 includes a feedback mechanism wherein an inverter 508 initially causes a keeper PFET 510 to maintain the node 504 at logic high potential. Thus, in a read mode of operation, when Global_Column_Select goes high while Global_Write_Control stays off, the keeper PFET 510 holds node 504 high. Consequently, since node 504 is high in the read mode, the outputs of NOR gates 502 are low, in turn rendering the outputs of NOR gates 404 high (by virtue of the low output of inverter 402). The NFET stacks 302 of the circuit 500 are thus ready to read out the cell data.

In the write mode, both the Global_Write_Control signal and the Global_Column_Select signal are active high. As node 504 begins to be pulled to ground, inverter 508 in the dynamic NAND gate 506 begins to deactivate keeper PFET 510 until it no longer opposes the discharge of node 504. Once node 504 is discharged, the differential input write data will be coupled to GWBC and GWBT by NOR gates 502. Upon one of GWBC and GWBT becoming charged to logic high, the corresponding one of the NFET stacks 302 will be deactivated. Thus, similar to the embodiment of FIG. 4, the end result is to prevent a condition where both Read_Data_Out_C and Read_Data_Out_T are being discharged as a result of a Fast Read Before Write scenario.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A global to local bit line interface circuit for domino static random access memory (SRAM) devices, the circuit comprising:
    a pair of complementary global write bit lines in selective communication with an array of SRAM cells through corresponding local write bit lines, the complementary global write bit lines configured to write a selected SRAM cell with data presented on a pair of complementary write data input lines;
    a pair of complementary global read bit lines in selective communication with the array of SRAM cells through corresponding local read bit lines, the complementary global read bit lines configured to read data stored in a selected SRAM cell and present the read data on a pair of complementary read data output lines; and
    blocking logic configured to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

2. The circuit of claim 1, wherein the blocking logic is controlled by signals present on the complementary global write bit lines.

3. The circuit of claim 2, wherein the blocking logic further comprises a pair NFET stacks coupled to the complementary read data output lines, wherein activation of the NFET stacks for a read operation is controlled by a first pair of parallel configured NOR gates, a first input of which is controlled by a global column select signal and a second input of which is controlled by one of the complementary global write bit lines.

4. The circuit of claim 3, wherein:
    for the read operation, outputs of the first pair of NOR gates are both logic high so as to place both the NFET stacks in an active state, such that complementary read data output lines will propagate data presented on the complementary global read bit lines; and
    for the write operation, an output of one of the first pair of NOR gates is logic low so as to place one of the NFET stacks in a deactive state, such that the corresponding one of the complementary read data output lines is maintained at the precharged level.

5. The circuit of claim 4, wherein both the complementary global read bit lines and the complementary global write bit lines are precharged at a logic high level.

6. The circuit of claim 5, wherein the first input of the first pair of parallel configured NOR gates is an inverted value of one of the signal on a corresponding one of the complementary global write bit lines, and the second input of the first pair of parallel configured NOR gates is an inverted value of the global column select signal.

7. The circuit of claim 6, further comprising write NFETs configured to couple the complementary global write bit lines to the complementary write data input lines, the write NFETs driven by AND logic coupled to the global column select signal and a global write control signal.

8. The circuit of claim 4, wherein the complementary global read bit lines are precharged at a logic high level, and the complementary global write bit lines are precharged at a logic low level.

9. The circuit of claim 8, wherein the first input of the first pair of parallel configured NOR gates is coupled directly to a corresponding one of the complementary global write bit lines, and the second input of the first pair of parallel configured NOR gates is an inverted value of the global column select signal.

10. The circuit of claim 9, further comprising a second pair of parallel NOR gates configured to couple the complementary global write bit lines to the complementary write data input lines, the second pair of parallel NOR gates driven by dynamic NAND logic coupled to the global column select signal and a global write control signal.

11. A method of implementing reading and writing data in domino static random access memory (SRAM) devices, the method comprising:
    selectively coupling a pair of complementary global write bit lines in with an array of SRAM cells through corresponding local write bit lines, the complementary global write bit lines configured to write a selected SRAM cell with data presented on a pair of complementary write data input lines;
    selectively coupling a pair of complementary global read bit lines with the array of SRAM cells through corresponding local read bit lines, the complementary global read bit lines configured to read data stored in a selected SRAM cell and present the read data on a pair of complementary read data output lines; and
    configuring blocking logic to prevent, during a write operation, propagation of stored data from the SRAM cells out on the complementary read data output lines, via the complementary global read bit lines, prior to completion of the write operation by ensuring that one of the complementary read data output lines is maintained at a precharged level, regardless of the value of any data present on the complementary global read bit lines during the write operation.

12. The method of claim 11, wherein the blocking logic is controlled by signals present on the complementary global write bit lines.

13. The method of claim 12, wherein the blocking logic further comprises a pair NFET stacks coupled to the complementary read data output lines, wherein activation of the NFET stacks for a read operation is controlled by a first pair of parallel configured NOR gates, a first input of which is controlled by a global column select signal and a second input of which is controlled by one of the complementary global write bit lines.

14. The method of claim 13, wherein:
    for the read operation, outputs of the first pair of NOR gates are both logic high so as to place both the NFET stacks in an active state, such that complementary read data output lines will propagate data presented on the complementary global read bit lines; and
    for the write operation, an output of one of the first pair of NOR gates is logic low so as to place one of the NFET stacks in a deactive state, such that the corresponding one of the complementary read data output lines is maintained at the precharged level.

15. The method of claim 14, wherein both the complementary global read bit lines and the complementary global write bit lines are precharged at a logic high level.

16. The method of claim 15, wherein the first input of the first pair of parallel configured NOR gates is an inverted value of one of the signal on a corresponding one of the complementary global write bit lines, and the second input of the first pair of parallel configured NOR gates is an inverted value of the global column select signal.

17. The method of claim 16, further comprising configuring write NFETs to couple the complementary global write bit lines to the complementary write data input lines, the write NFETs driven by AND logic coupled to the global column select signal and a global write control signal.

18. The method of claim 14, wherein the complementary global read bit lines are precharged at a logic high level, and the complementary global write bit lines are precharged at a logic low level.

19. The method of claim 18, wherein the first input of the first pair of parallel configured NOR gates is coupled directly to a corresponding one of the complementary global write bit lines, and the second input of the first pair of parallel configured NOR gates is an inverted value of the global column select signal.

20. The method of claim 19, further comprising configuring a second pair of parallel NOR gates to couple the complementary global write bit lines to the complementary write data input lines, the second pair of parallel NOR gates driven by dynamic NAND logic coupled to the global column select signal and a global write control signal.

* * * * *